(12) United States Patent
Swift et al.

(10) Patent No.: US 7,563,681 B2
(45) Date of Patent: Jul. 21, 2009

(54) DOUBLE-GATED NON-VOLATILE MEMORY AND METHODS FOR FORMING THEREOF

(75) Inventors: Craig T. Swift, Austin, TX (US); Thuy B. Dao, Austin, TX (US); Michael A. Sadd, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 91 days.

(21) Appl. No.: 11/341,973

(22) Filed: Jan. 27, 2006

(65) Prior Publication Data

US 2007/0178649 A1 Aug. 2, 2007

(51) Int. Cl.
 *H01L 21/8234* (2006.01)
(52) U.S. Cl. .................. 438/283; 438/157; 438/176; 438/455; 257/E21.122; 257/E21.623
(58) Field of Classification Search .......... 438/197, 438/283; 257/365
See application file for complete search history.

(56) References Cited

U.S. PATENT DOCUMENTS

| | | | |
|---|---|---|---|
| 5,773,331 A * | 6/1998 | Solomon et al. ............ 438/164 |
| 6,143,636 A | 11/2000 | Forbes et al. | |
| 6,339,002 B1 * | 1/2002 | Chan et al. ................. 438/283 |
| 6,424,001 B1 | 7/2002 | Forbes et al. | |
| 6,534,819 B2 * | 3/2003 | Tiwari et al. ............... 257/314 |
| 6,580,132 B1 * | 6/2003 | Chan et al. ................. 257/365 |
| 6,768,158 B2 | 7/2004 | Lee et al. | |
| 6,903,967 B2 | 6/2005 | Mathew et al. | |
| 7,057,234 B2 * | 6/2006 | Tiwari ....................... 257/324 |
| 7,141,476 B2 * | 11/2006 | Dao .......................... 438/283 |
| 7,205,185 B2 * | 4/2007 | Dokumaci et al. .......... 438/197 |
| 2001/0030340 A1 * | 10/2001 | Fujiwara ..................... 257/314 |
| 2004/0108537 A1 | 6/2004 | Tiwari | |
| 2004/0110097 A1 * | 6/2004 | Ahmed et al. ............... 430/313 |
| 2004/0197977 A1 * | 10/2004 | Deleonibus ................. 438/202 |
| 2004/0222471 A1 * | 11/2004 | Inoh .......................... 257/365 |

(Continued)

OTHER PUBLICATIONS

Oh et al; "Damascene Gate FinFET SONOS Memory Implemented on Bulk Silicon Wafer"; Electron Devices Meeting, 2004. IEDM Technical Digest. IEEE International; Dec. 13-15, 2004 pp. 893-896.

(Continued)

*Primary Examiner*—W. David Coleman
*Assistant Examiner*—Shaka Scarlett
(74) *Attorney, Agent, or Firm*—Hamilton & Terrile, LLP; Michael Rocco Cannatti (57) ABSTRACT

A method for making a semiconductor device comprises providing a first wafer and providing a second wafer having a first side and a second side, the second wafer including a semiconductor structure, a first storage layer, and a layer of gate material, wherein the first storage layer is located between the semiconductor structure and the layer of gate material and closer to the first side of the second wafer than the semiconductor structure. The method further includes bonding the first side of the second wafer to the first wafer and cleaving away a first portion of the semiconductor structure to leave a layer of the semiconductor structure after the bonding. The method further includes forming a second storage layer over the layer of the semiconductor structure and forming a top gate over the second storage layer.

16 Claims, 9 Drawing Sheets

U.S. PATENT DOCUMENTS

2005/0037582 A1* 2/2005 Dennard et al. ............. 438/281
2005/0110088 A1* 5/2005 Hofmann et al. ............ 257/347
2005/0145926 A1  7/2005 Lee
2005/0280103 A1* 12/2005 Langdo et al. .............. 257/401
2005/0282318 A1* 12/2005 Dao ........................... 438/151
2007/0012988 A1* 1/2007 Bhattacharyya ............. 257/314

OTHER PUBLICATIONS

Specht et al; "20 nm tri-gate SONOS memory cells with multi-level operation"; Electron Devices Meeting, 2004. IEDM Technical Digest. IEEE International; Dec. 13-15, 2004 pp. 1083-1085.

Yuen et al; "A 2-Bit MONOS Nonvolatile Memory Cell Based on Asymmetric Double Gate MOSFET Structure"; Electron Device Letters, IEEE vol. 24, Issue 8, Aug. 2003 pp. 518-520.

Specht et al; "Novel Dual Bit Tri-Gate Charge Trapping Memory Devices"; Electron Device Letters, IEEE vol. 25, Issue 12, Dec. 2004 pp. 810-812.

Xuan et al; "FinFET SONOS Flash memory for Embedded Applications"; Electron Devices Meeting, 2003. IEDM '03 Technical Digest. IEEE International; Dec. 8-10, 2003 pp. 26.4.1-26.4.4.

Avci et al; "Back-Floating Gate Non-Volatile Memory"; SOI Conference, 2004. Proceedings. 2004 IEEE International; Oct. 4-7, 2004 pp. 133-135.

Kumar et al; "Scaling of Flash NVRAM to 10's of nm by Decoupling of Storage From Read/Sense Using Back-Floating Gates"; Nanotechnology, IEEE Transactions on vol. 1, Issue 4, Dec. 2002 pp. 247-254.

* cited by examiner

DOUBLE-GATED NON-VOLATILE MEMORY AND METHODS FOR FORMING THEREOF

RELATED APPLICATIONS

A related, copending application is entitled "Method of Forming a Transistor with a Bottom Gate," by Thuy Dao, application Ser. No. 10/871,402, assigned to Freescale Semiconductor, Inc., and was filed on Jun. 18, 2004.

A related, copending application is entitled "Back-Gated Semiconductor Device with a Storage Layer and Methods for Forming Thereof," by Swift et al., application Ser. No. 11/300,077, assigned to Freescale Semiconductor, Inc., and was filed on Dec. 14, 2005.

BACKGROUND OF THE INVENTION

1. Field of the Invention

This invention relates in general to semiconductor devices and more specifically to a double-gated non-volatile memory and methods for forming thereof.

2. Description of the Related Art

Traditional single gate and double gate Fully Depleted Semiconductor-on-Insulator (FDSOI) transistors have advantages related to reduced short channel effects and reduced un-wanted parasitic capacitances. However, integration of non-volatile memory (NVM) elements with such FDSOI transistors is complicated. Further, when hot carrier injection (HCI) programming is used to program such NVM elements, a body tie is necessary to prevent undesired charge accumulation in the channel region of the device.

Thus, there is a need for improved FDSOI transistors for use as a non-volatile memory and methods of forming and programming thereof.

BRIEF DESCRIPTION OF THE DRAWINGS

The present invention may be better understood, and its numerous objects, features, and advantages made apparent to those skilled in the art by referencing the accompanying drawings.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The following sets forth a detailed description of a mode for carrying out the invention. The description is intended to be illustrative of the invention and should not be taken to be limiting.

In one embodiment, a method for making a semiconductor device is provided. The method includes providing a first wafer and providing a second wafer having a first side and a second side, the second wafer including a semiconductor structure, a first storage layer, and a layer of gate material, wherein the first storage layer is located between the semiconductor structure and the layer of gate material and closer to the first side of the second wafer than the semiconductor structure. The method further includes bonding the first side of the second wafer to the first wafer and cleaving away a first portion of the semiconductor structure to leave a layer of the semiconductor structure after the bonding. The method further includes forming a second storage layer over the layer of the semiconductor structure and forming a top gate over the second storage layer.

In another embodiment, a method of forming a transistor is provided. The method includes providing a wafer comprising a semiconductor layer, a first storage layer, and a first layer of gate material, wherein the first storage layer is located between the semiconductor layer and the first layer of gate material. The method further includes forming a second storage layer over the semiconductor layer and forming a second layer of gate material over the second layer of nanocrystals. The method further includes patterning the semiconductor layer to leave a first portion of the semiconductor layer to function as a channel of the transistor and after the patterning the semiconductor layer, patterning the first layer of gate material to leave a first portion of the first layer of gate material wherein the first portion is covered by the first portion of the semiconductor layer and functions as a bottom gate of the transistor.

In yet another embodiment, a method includes providing a first device structure comprising a first semiconductor layer, a first insulating layer on the first semiconductor layer, a first layer of gate material on the first insulating layer, a first storage layer on the first layer of gate material, and a second semiconductor layer on the first storage layer. The method further includes forming a second storage layer on the second semiconductor layer and forming a second layer of gate material on the second storage layer. The method further includes patterning the second layer of gate material to leave a top gate. The method further includes implanting the second semiconductor layer using the top gate as a mask to form source/drain regions in the second semiconductor layer. The method further includes forming a first sidewall spacer on sides of the top gate and etching through portions of the source/drain regions, through portions of the first storage layer; and through portions of the first layer of gate material and laterally etching a portion of the first layer of gate material, wherein the etching through portions of the first layer of gate material to remove portions of the first layer of gate material from under the sidewall spacer leaves a bottom gate.

Figure 1:
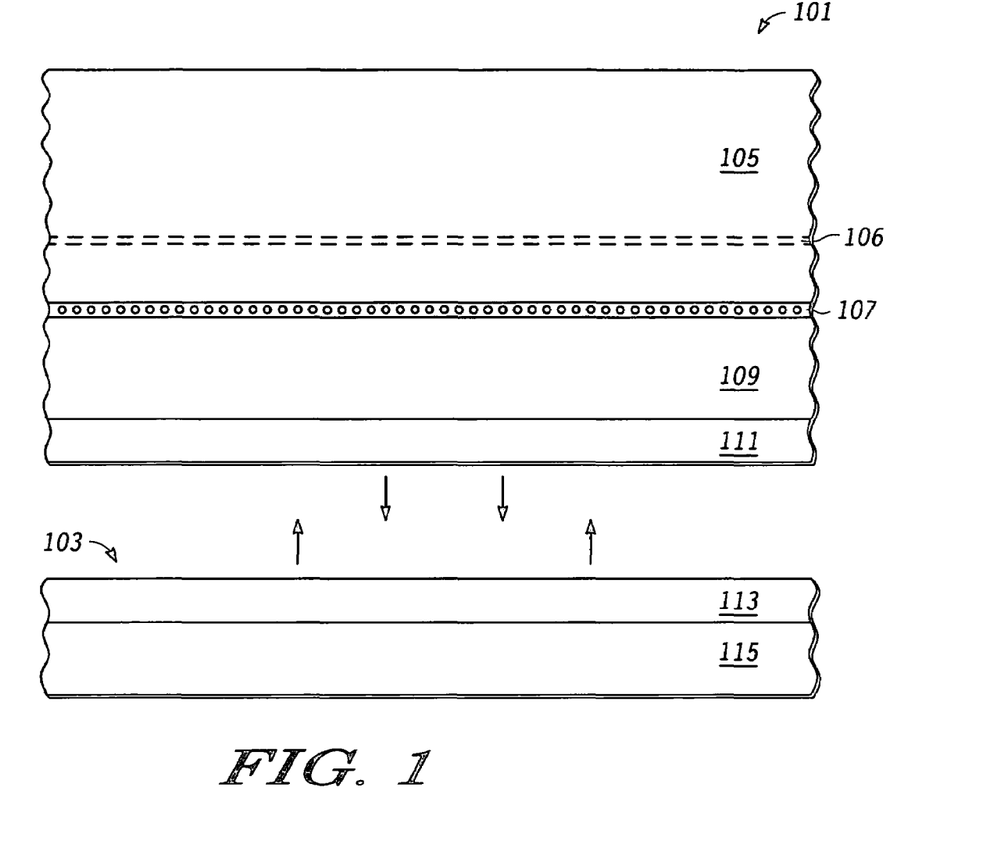
FIG. 1 is a side view of one embodiment of two wafers being bonded together to form a resultant wafer, consistent with one embodiment of the invention.

FIG. 1 shows a side view of two wafers 101 and 103 that are to be bonded together to form a resultant wafer (201 of FIG. 2), from which non-volatile memory cells may be formed, for example. Wafer 101 includes a layer 109 of gate material, a storage layer 107, and semiconductor substrate 105. By way of example, substrate 105 is made of monocrystaline silicon, but in other embodiments, may be made of other types of semiconductor materials such as silicon carbon, silicon germanium, germanium, type III-V semiconductor materials, type II-VI semiconductor materials, and combinations thereof including multiple layers of different semiconductor materials. In some embodiments, semiconductor material of substrate 105 may be strained. Storage layer 107 may be a thin film storage layer or a stack formed by surrounding a charge storage material by one or more dielectric materials. The charge storage material may be made of any suitable material, such as nitrides or nanocrystals, or a combination thereof. Nanocrystals, such as metal nanocrystals, semiconductor (e.g., silicon, germanium, gallium arsenide) nanocrystals, or a combination thereof may be used. Storage layer 107 may be formed by a chemical vapor deposition process, a sputtering process, or another suitable deposition process.

Referring still to FIG. 1, by way of example, layer 109 includes doped polysilicon, but may be made of other materials such as, amorphous silicon, tungsten, tungsten silicon, germanium, amorphous germanium, titanium, titanium nitride, titanium silicon, titanium silicon nitride, tantalum, tantalum silicon, tantalum silicon nitride, other silicide materials, other metals, or combinations thereof including multiple layers of different conductive materials. An insulator 111 may be formed (e.g., grown or deposited) on layer 109. In one embodiment, insulator 111 includes silicon oxide, but may include other materials such as e.g. PSG, FSG, silicon nitride, and/or other types of dielectric including high thermal, conductive dielectric materials.

Wafer 103 may include a substrate 115 (e.g., silicon) with an insulator 113 formed on it. In one embodiment, the material of insulator 113 is the same as the material of insulator 111. By way of example, wafer 103 includes a metal layer (not shown) at a location in the middle of insulator 113. This metal layer may be utilized for noise reduction in analog devices built from resultant wafer 201.

Wafer 101 is shown inverted so as to be bonded to wafer 103 in the orientation shown in FIG. 1. In one embodiment, insulator 111 is bonded to insulator 113 with a bonding material. In other embodiments, wafer 101 may be bonded to wafer 103 using other bonding techniques. For example, in one embodiment, wafer 101 may be bonded to wafer 103 by electrostatic bonding followed by thermal bonding or pressure bonding.

In some embodiments, wafer 101 does not include insulator 111 where layer 109 is bonded to insulator 113. In other embodiments, wafer 103 does not include insulator 113 where insulator 111 is bonded to substrate 115.

Wafer 101 may include a stress layer 106 formed by implanting a dopant (e.g. H+) into substrate 105. In some embodiments, the dopant is implanted prior to the formation of storage layer 107, but in other embodiments, may be implanted at other times including after the formation of storage layer 107 and prior to the formation of layer 109, after the formation of layer 109 and prior to the formation of insulator 111, or after the formation of insulator 111. In other embodiments, the dopant for forming stress layer 106 may be implanted after wafer 103 has been bonded to wafer 101.

Figure 2:
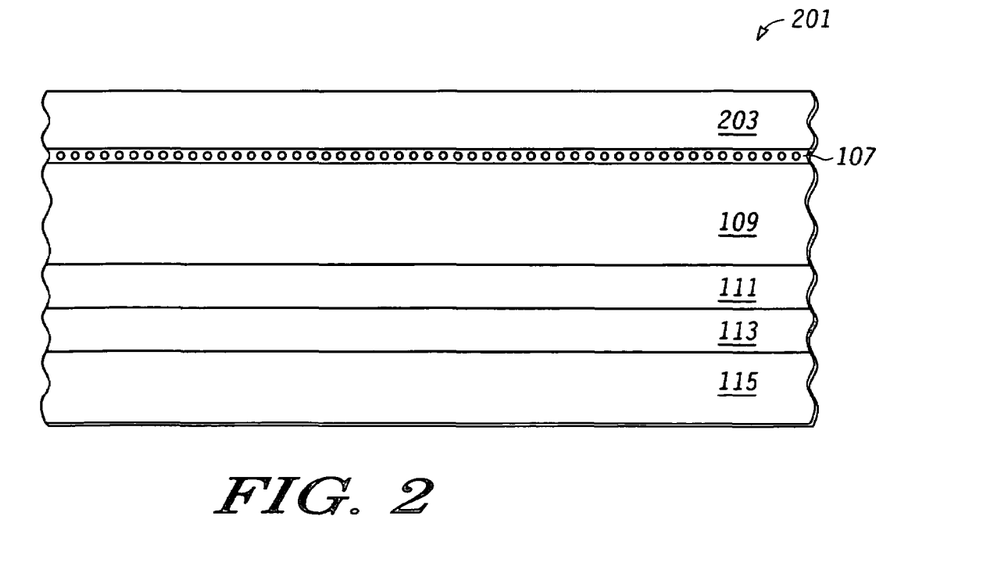
FIG. 2 shows a side view of one embodiment of a bonded wafer, consistent with one embodiment of the invention.

FIG. 2 shows a side view of resultant wafer 201 after wafer 103 and 101 have been bonded together. The view in FIG. 2 also shows wafer 201 after a top portion of substrate 105 has been removed, e.g., by cleaving. By way of example, cleaving is performed by dividing substrate 105 at stress layer 106. Layer 203 is the remaining portion of substrate 105 after the cleaving. One advantage of forming the layer by cleaving is that it may allow for a channel region to be formed from a relatively pure and crystalline structure as opposed to a semiconductor layer that is grown or deposited on a dielectric.

Figure 3:
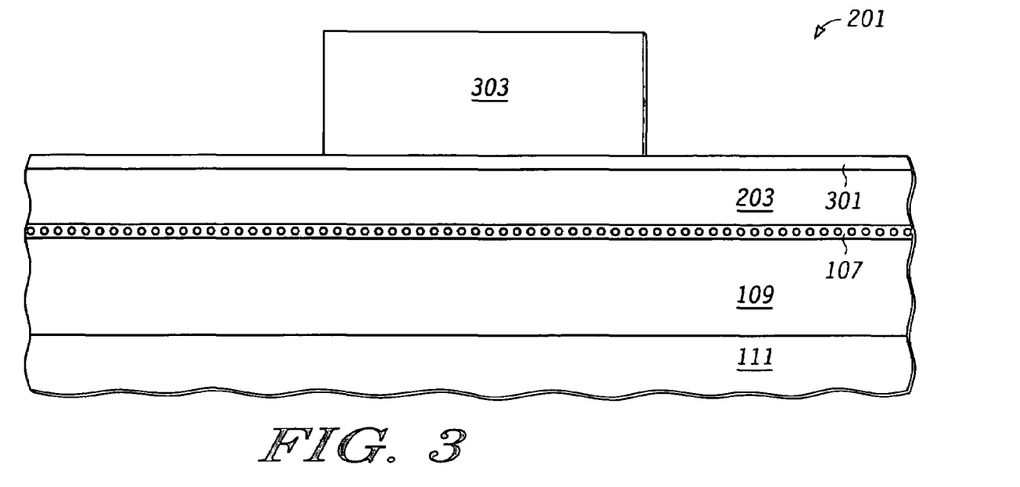
FIG. 3 shows a partial cross-sectional side view of one embodiment of a wafer during a stage in its manufacture, consistent with one embodiment of the invention.

FIG. 3 shows a partial side cross-sectional view of wafer 201. Not shown in the view of FIG. 3 (or in subsequent Figures) are insulator 113 and substrate 115. After substrate 105 is cleaved to form layer 203, a sacrificial dielectric layer 301 (e.g. nitride or oxide) is formed on layer 203 (e.g. by growing or depositing). A patterned mask 303 is then formed over layer 301. In one embodiment, mask 303 is formed by patterning a layer of photo resist.

Figure 4:
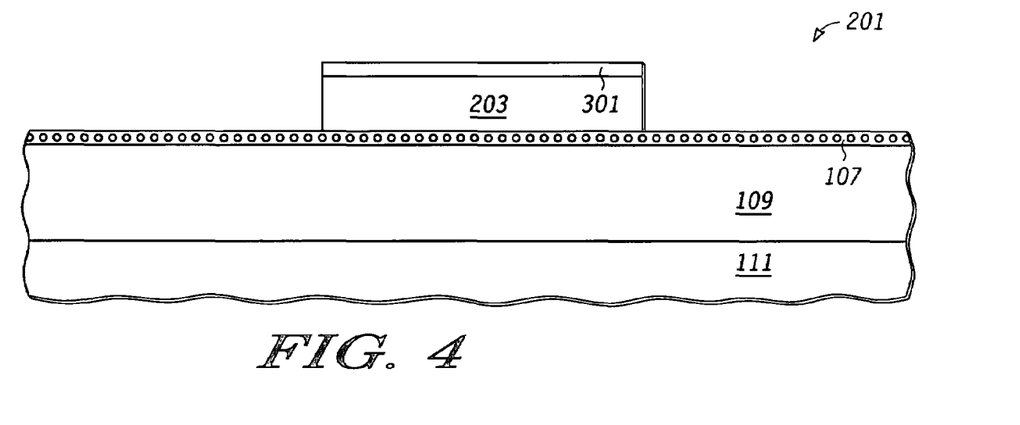
FIG. 4 shows a partial cross-sectional side view of one embodiment of a wafer during another stage in its manufacture, consistent with one embodiment of the invention.

FIG. 4 is a partial side cross-sectional view of wafer 201 after layers 301 and 203 have been patterned using mask 303 and after mask 303 has been removed. The channel of a double gate transistor will be subsequently formed in the remaining portion of layer 203.

Figure 5:
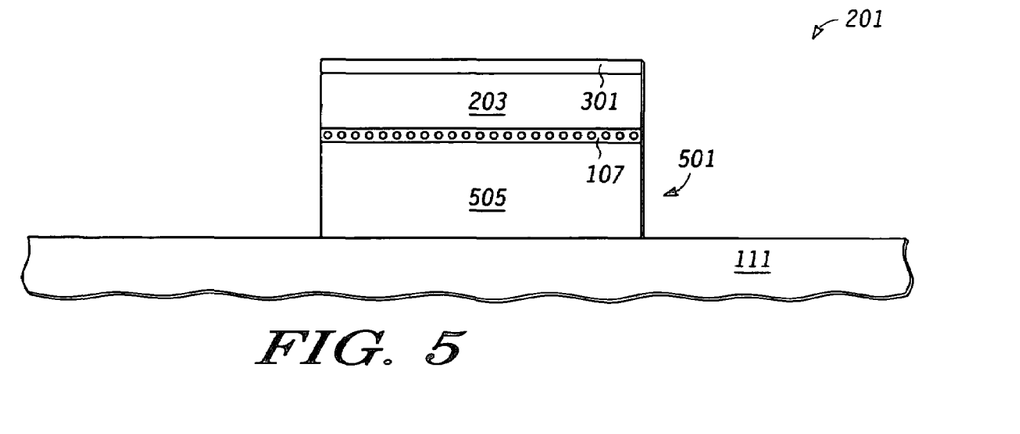
FIG. 5 shows a partial cross-sectional side view of one embodiment of a wafer during another stage in its manufacture, consistent with one embodiment of the invention.

Referring now to FIG. 5, after layer 203 has been patterned, layer 109 and storage layer 107 may be patterned and then etched to form structure 501.

Figure 6:
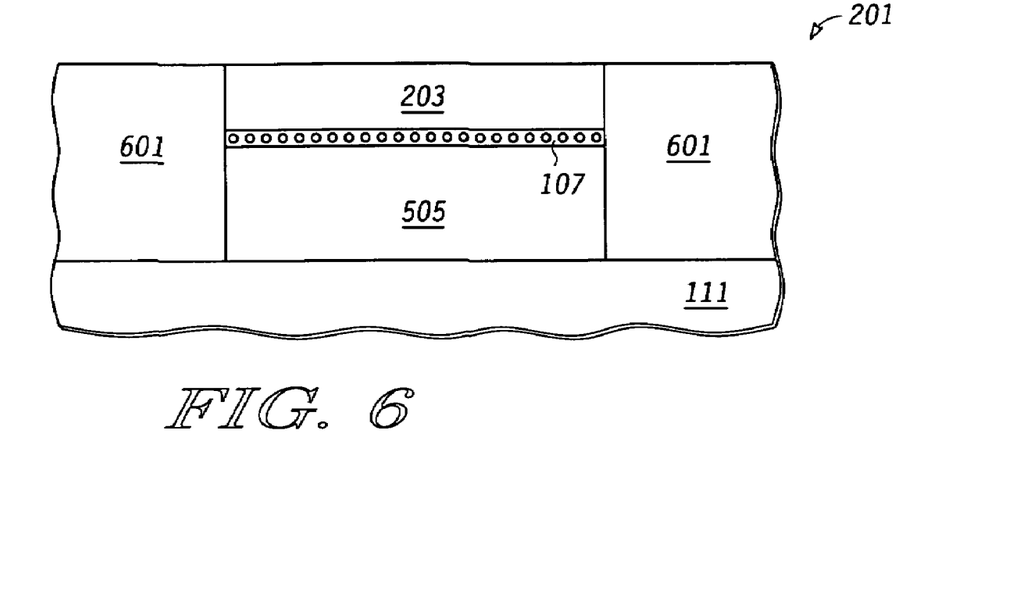
FIG. 6 shows a partial cross-sectional side view of one embodiment of a wafer during another stage in its manufacture, consistent with one embodiment of the invention.

FIG. 6 shows a partial cross-sectional side view of wafer 201 after a layer of dielectric 601 (e.g. silicon oxide, TEOS, or CVD oxide) is deposited over wafer 201 and wafer 201 is then subject to a chemical mechanical polish (CMP) to planarize it. In one embodiment, layer 301 is used as a polish stop for the CMP, where afterwards, a wet etch may be used to remove layer 301.

Figure 7:
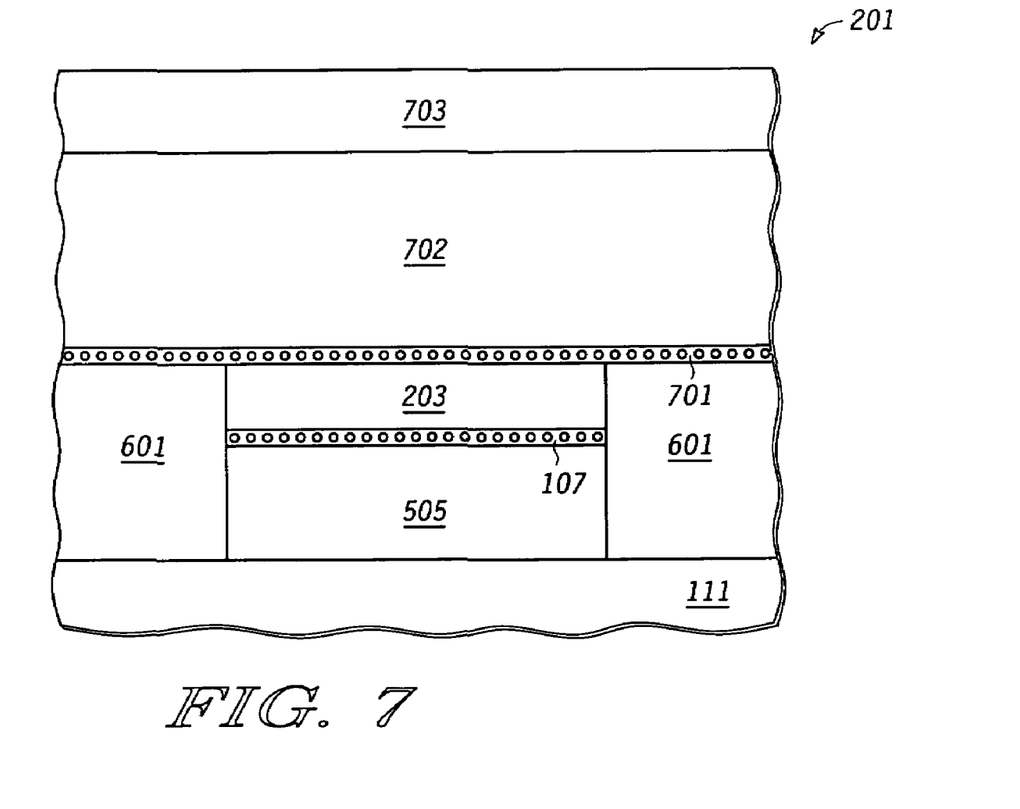
FIG. 7 shows a partial cross-sectional side view of one embodiment of a wafer during another stage in its manufacture, consistent with one embodiment of the invention.

FIG. 7 shows a partial cross-sectional side view of wafer 201 after a second storage layer 701, a top gate material layer 702, and a hard mask 703 are formed over wafer 201. Second storage layer 701 may be a thin film storage layer or a stack formed by surrounding a charge storage material by one or more dielectric materials. The charge storage material may be made of any suitable material, such as nitrides or nanocrystals, or a combination thereof. Nanocrystals, such as metal nanocrystals, semiconductor (e.g., silicon, germanium, gallium arsenide) nanocrystals, or a combination thereof may be used. Second storage layer 701 may be formed by a chemical vapor deposition process, a sputtering process, or another suitable deposition process. In one embodiment, layer 702 is made of polysilicon, but may be made of other materials including the materials set forth above with respect to layer 109. In one embodiment, hard mask 703 is made of a dielectric (e.g., nitride) that is not removed during subsequent etching of layers 107, 203, 505, 601, 701, or 702 and/or may be formed by a CVD process (e.g., LPCVD, MOCVD). In some embodiments, hard mask 703 may be made of multiple layers of different materials. Hard mask 703 is utilized to protect layer 702 during subsequent processing.

Figure 8:
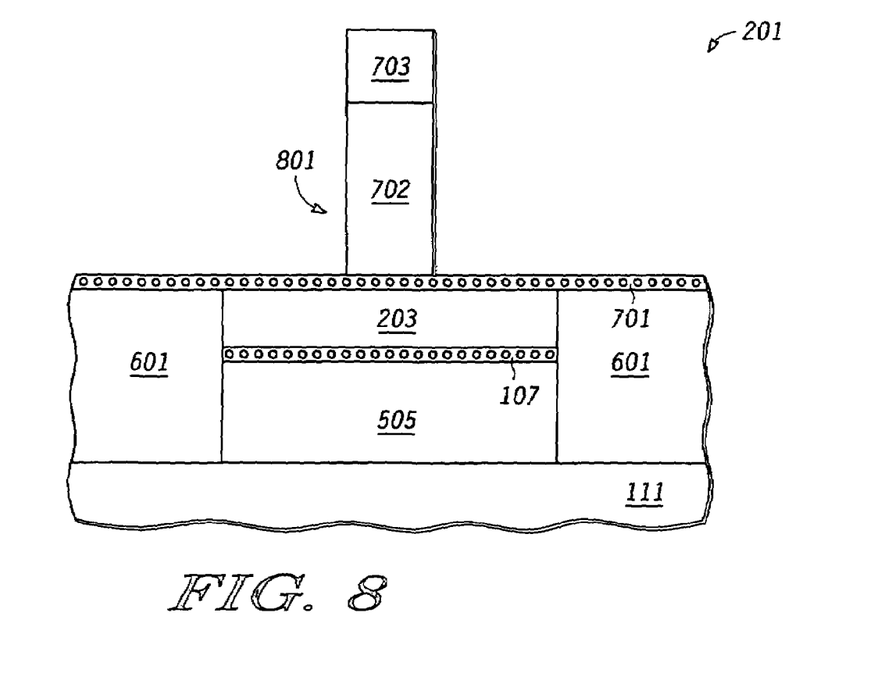
FIG. 8 shows a partial cross-sectional side view of one embodiment of a wafer during another stage in its manufacture, consistent with one embodiment of the invention.

FIG. 8 shows a partial side cross-sectional view of wafer 201 after hard mask 703 and layer 702 have been patterned to form structure 801. Structure 801 includes a portion of layer 702 from which the top gate of a double gate transistor will be formed. Structure 801 also includes a portion of layer 703 located over a corresponding portion of layer 702. By way of example, structure 801 may be patterned with a patterned mask (not shown) formed over hard mask 703.

Figure 9:
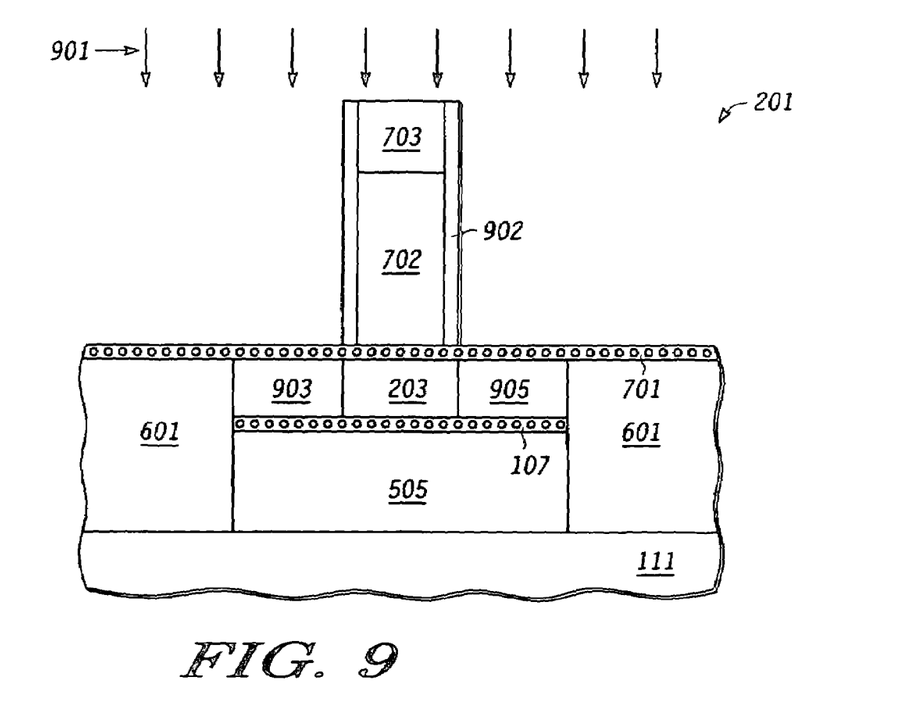
FIG. 9 shows a partial cross-sectional side view of one embodiment of a wafer during another stage in its manufacture, consistent with one embodiment of the invention.

FIG. 9 shows a partial cross-sectional side view of wafer 201 after liner 902 is formed on the sidewalls of structure 801. By way of example, liner 902 is a dielectric (e.g., oxide, nitride, or combinations thereof). In some embodiments, the dielectric may include multiple layers of dielectric materials. Implants 901 may be performed at this stage to form source/drain regions 903 and 905. In some embodiments, this implantation may be performed before the dielectric material of liner 902 is deposited.

Figure 10:
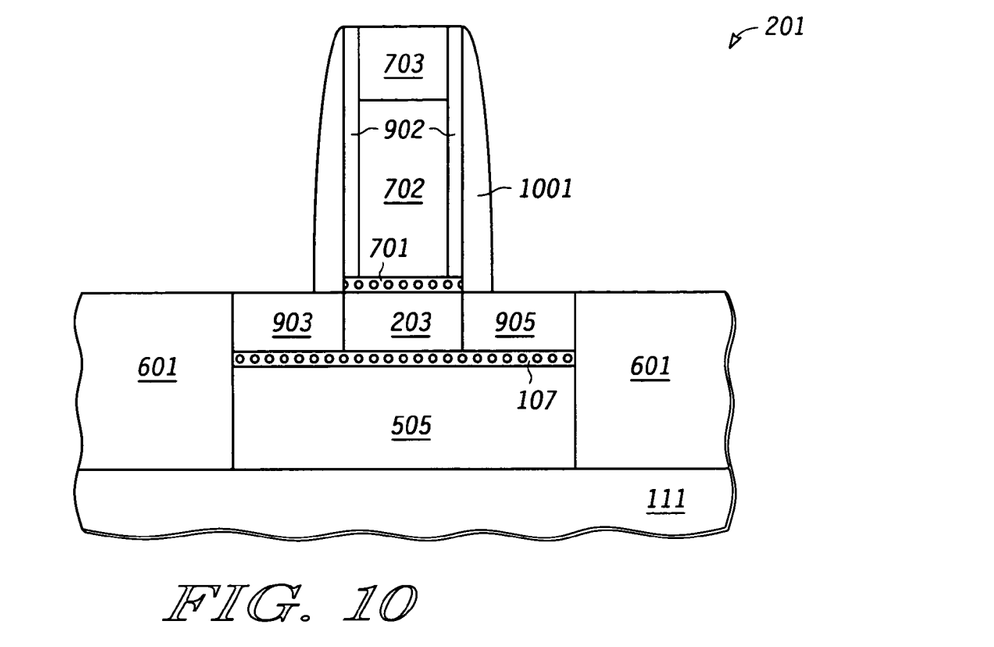
FIG. 10 shows a partial cross-sectional side view of one embodiment of a wafer during another stage in its manufacture, consistent with one embodiment of the invention.

FIG. 10 shows a partial cross-sectional side view of wafer 201 after an exposed portion of second storage layer 701 is removed and another dielectric spacer 1001 is subsequently formed on the sidewalls of liner 902. By way of example, the exposed portion of second storage layer 701 may be removed by an anisotropic dry etch process selective with respect to the material of layer 203, but may be removed by other processes in other embodiments. In one embodiment, spacer 1001 is a dielectric (e.g., oxide, nitride, or combinations thereof). In some embodiments, the dielectric may include multiple layers of dielectric materials. In some embodiments, the formation of spacer 1001 may be omitted.

Figure 11:
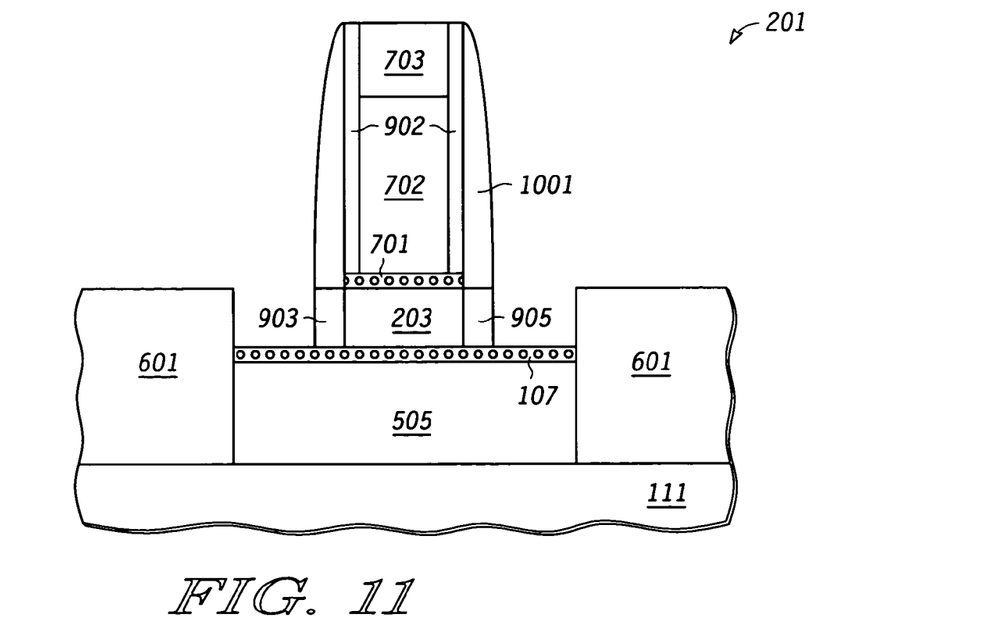
FIG. 11 shows a partial cross-sectional side view of one embodiment of a wafer during another stage in its manufacture, consistent with one embodiment of the invention.

FIG. 11 shows a partial cross-sectional side view of wafer 201 after the exposed portions of layers 903 and 905 are removed. In one embodiment, the exposed portions of layers 903 and 905 may be removed by an anisotropic dry etch that is stopped at storage layer 107.

Figure 12:
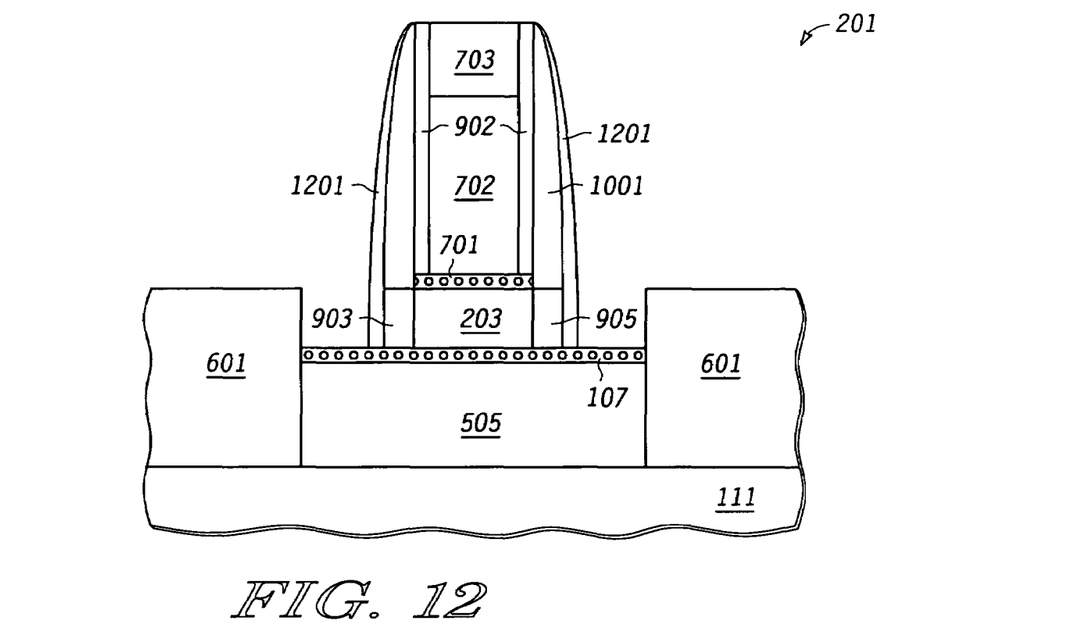
FIG. 12 shows a partial cross-sectional side view of one embodiment of a wafer during another stage in its manufacture, consistent with one embodiment of the invention.

FIG. 12 shows a partial cross-sectional side view of wafer 201 after a second spacer 1201 is formed on the sidewalls of spacer 1001 and channel region 203. By way of example, spacer 1201 may be made of nitride, oxide, or combinations thereof. In some embodiments, spacer 1201 may be made of multiple layers of dielectric materials. Spacer 1201 protects exposed portions of channel region 203 during subsequent processing.

Figure 13:
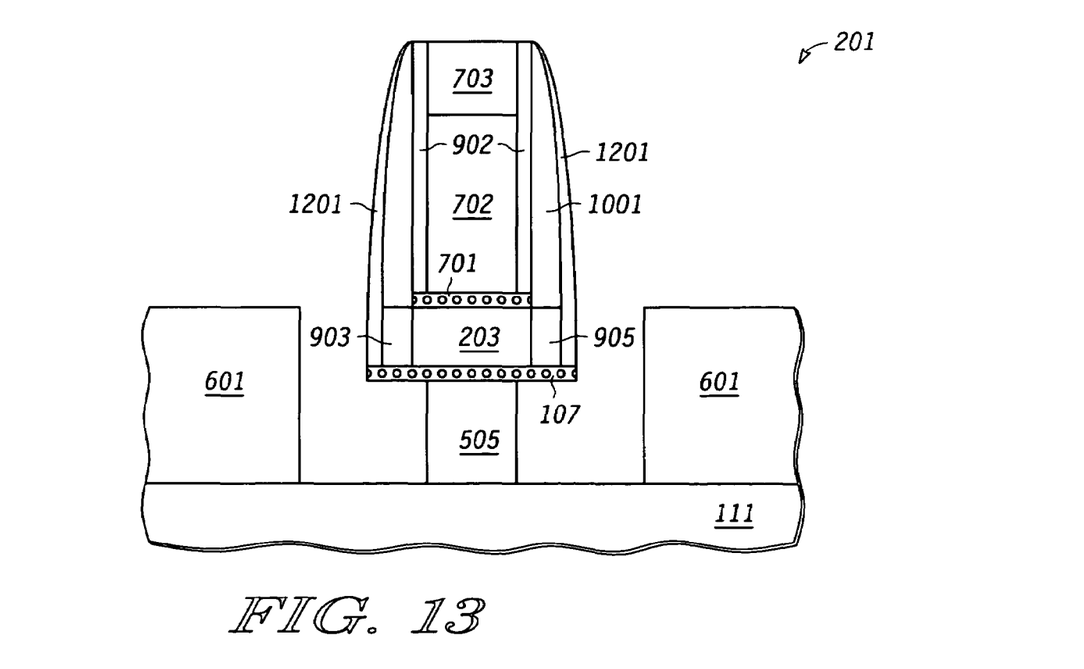
FIG. 13 shows a partial cross-sectional side view of one embodiment of a wafer during another stage in its manufacture, consistent with one embodiment of the invention.

FIG. 13 shows a partial cross-sectional side view of wafer 201 after an exposed portion of storage layer and all but a portion of layer 505 have been etched to form a bottom gate region 505. In case, storage layer 107 is similar to layer 505 then a spacer may be needed to protect storage layer 107 from being isotropically etched. Top gate material layer 702 and bottom gate region 505 may be doped using the same type of dopants or opposite type of dopants. In the embodiment shown, portions of portion 505 are removed by performing an anisotropic etch down to insulator 111 followed by a dry, isotropic etch. During the etching, structure 801 (as well as the spacers and channel region structure 203) may be used as a mask.

Figure 14:
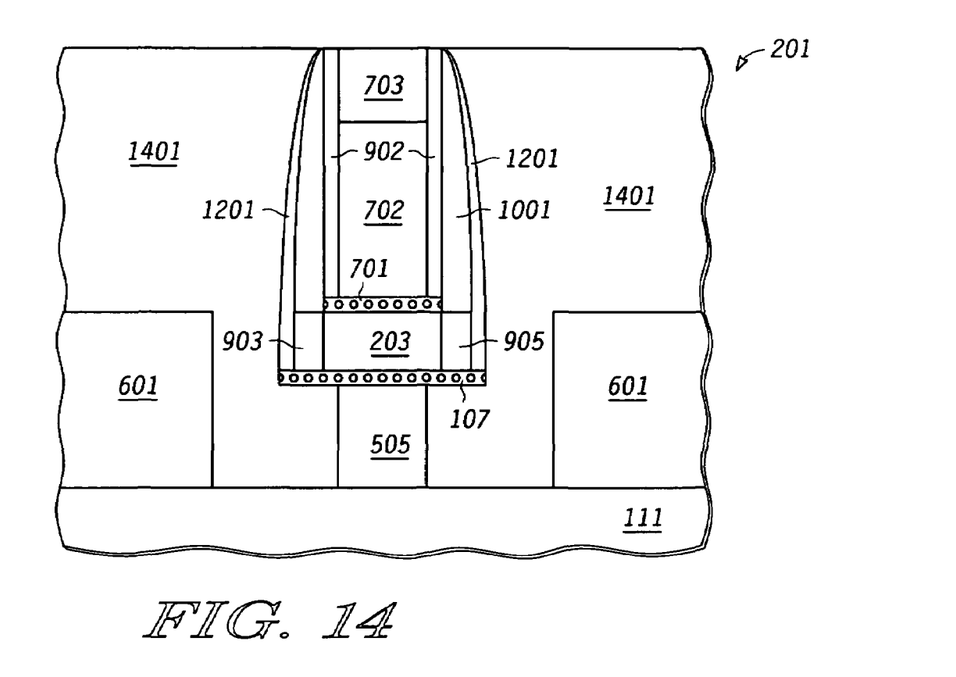
FIG. 14 shows a partial cross-sectional side view of one embodiment of a wafer during another stage in its manufacture, consistent with one embodiment of the invention.
Figure 15:
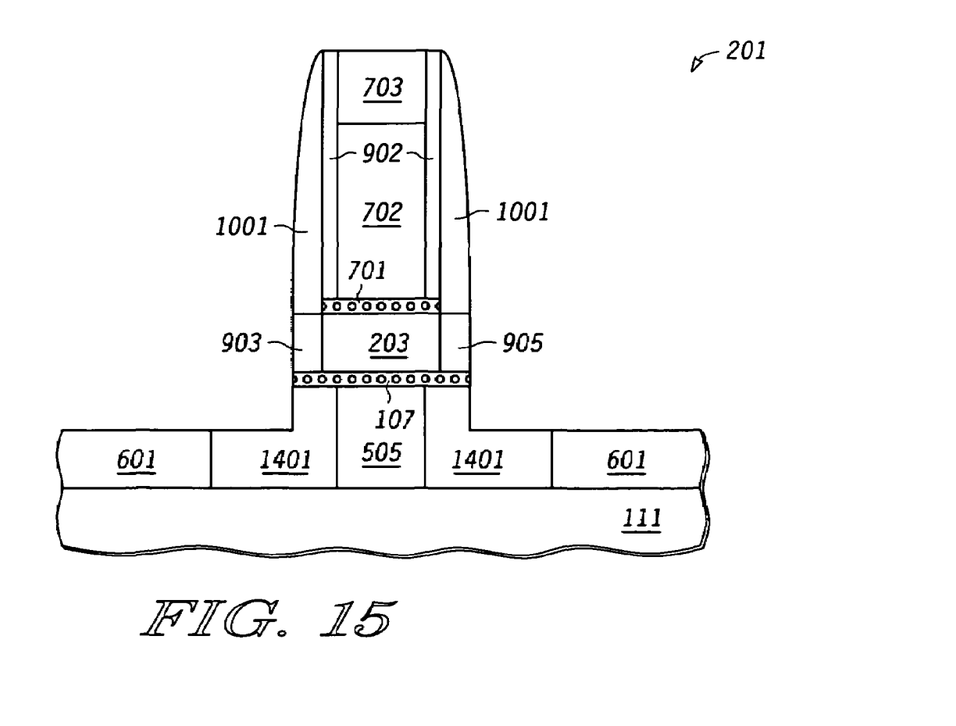
FIG. 15 shows a partial cross-sectional side view of one embodiment of a wafer during another stage in its manufacture, consistent with one embodiment of the invention.

FIG. 14 shows a partial cross-sectional side view of wafer 201 after a dielectric 1401 (e.g., silicon oxide, CVD oxide, TEOS, or SACVD) is deposited over wafer 201. Wafer 201 is then subject to a CMP process using a hardmask layer at the top as a polishing stop. Next, as shown in FIG. 15, dielectrics 1401 and 601 may be patterned and then etched to form a source/drain cavity. In a direction perpendicular to a direction connecting source and drain regions 903, 905, the etch of dielectrics 1401 and 601 may be prevented by covering them with a patterned photo-resist (not shown). Remaining portions of dielectrics 1401 and 601 may serve to electrically isolate adjacent semiconductor devices.

Figure 16:
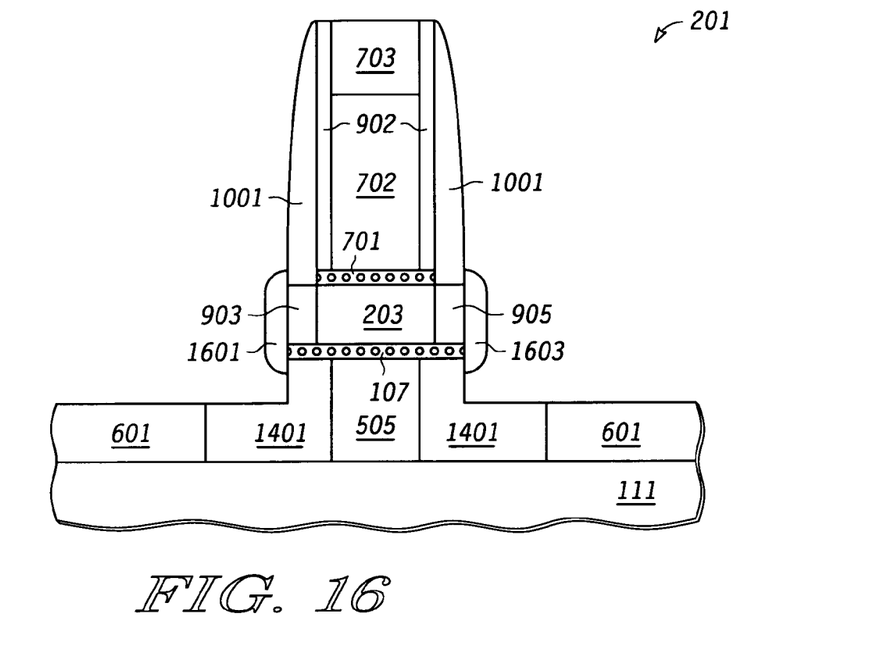
FIG. 16 shows a partial cross-sectional side view of one embodiment of a wafer during another stage in its manufacture, consistent with one embodiment of the invention.

FIG. 16 shows a partial cross-sectional side view of wafer 201 after selective silicon structures 1601 and 1603 are epitaxially grown on the exposed sidewalls of source/drain regions 903 and 905, respectively. Although FIG. 16 shows structures 1601 and 1603 grown beyond storage layer 107 and second storage layer 701, they may not be grown beyond these layers. In other embodiments, structures 1601 and 1603 may include other selective epitaxial films corresponding to those described for substrate 105.

Figure 17:
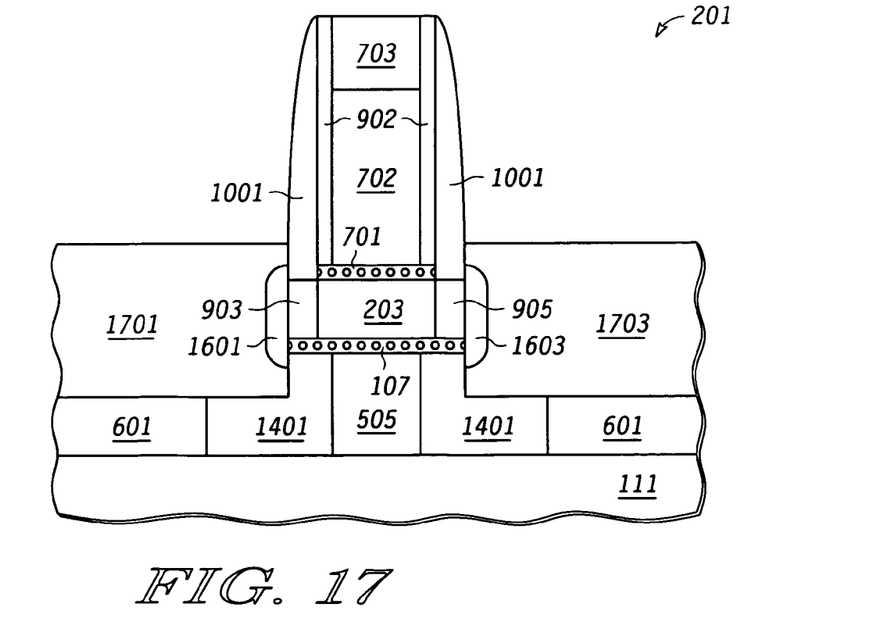
FIG. 17 shows a partial cross-sectional side view of one embodiment of a wafer during another stage in its manufacture, consistent with one embodiment of the invention.
Figure 18:
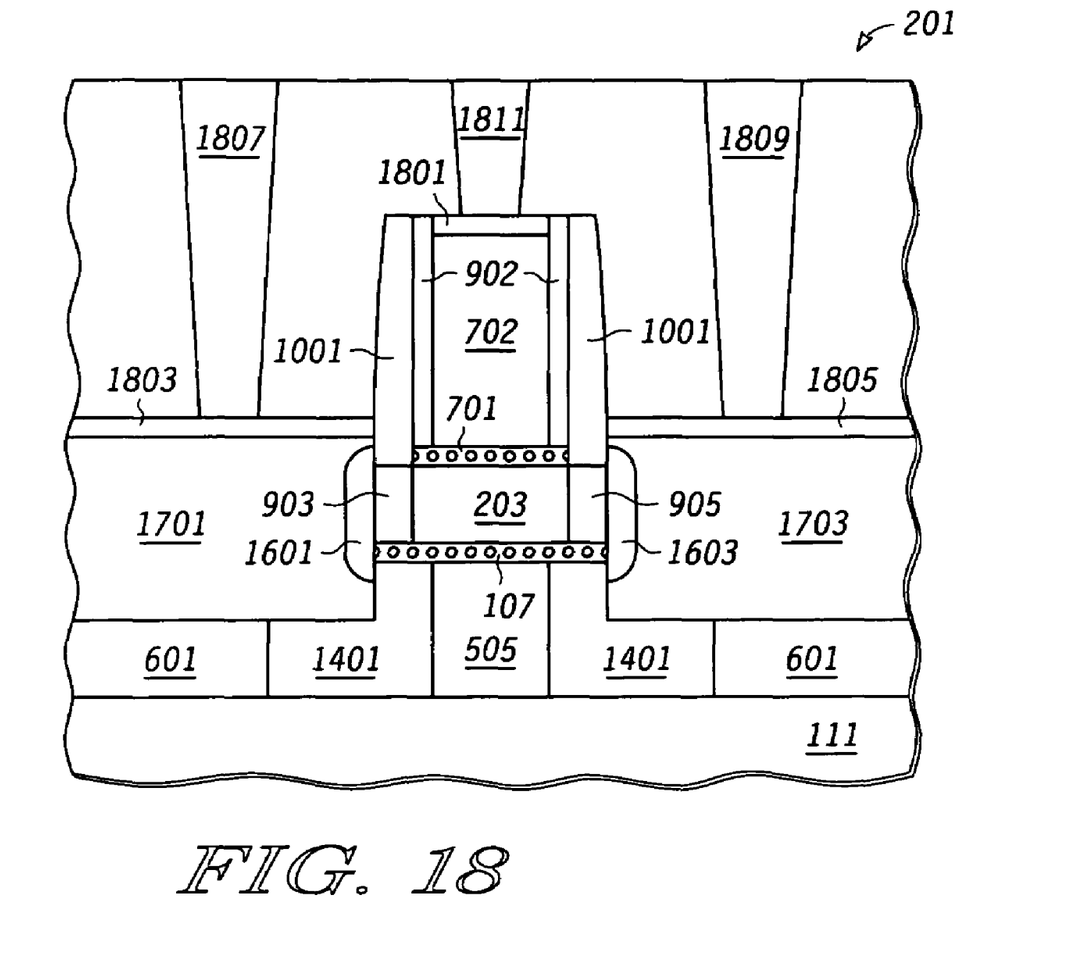
FIG. 18 shows a partial cross-sectional side view of one embodiment of a wafer during another stage in its manufacture, consistent with one embodiment of the invention.

FIG. 17 shows a partial cross-sectional side view of wafer 201 after source/drain regions 1701 and 1703 are formed. Although not shown, regions 1701 and 1703 may be formed by depositing silicon (e.g., polysilicon, amorphous silicon, or other semiconductor material), chemical-mechanical polishing to create a flat surface, and etching the silicon to recess. Next, as shown in FIG. 18, source/drain silicides 1803 and 1805 and gate silicide 1801 may be formed. Subsequently, source/drain contacts 1807 and 1809 and gate contact 1811 may be formed. Additional steps may be performed subsequent to or prior to the contact formation. Additionally, although the contacts are shown as being formed in a certain manner, they may be formed in other manners as well.

By way of example, the semiconductor device formed on wafer 201 may be used as a non-volatile memory. The non-volatile memory may include cells formed of the semiconductor device, which may be programmed using techniques such as, hot carrier injection or tunneling. By way of example, one bit per cell or as many as two bits per cell may be stored in the non-volatile memory cells. Using a voltage V in a range of 8-12 volts, in a one bit per cell mode, an erase operation may be performed by: (1) applying a −V or −V/2 voltage to top gate 702 (via contact 1811, for example); (2) applying a 0 voltage (grounding) or +V/2 voltage to source region via contact 1807; (3) applying a 0 or +V/2 voltage to drain region via contact 1809; and (4) applying a −V or −V/2 voltage to bottom gate region 505 (via a contact not shown). Thus, one set of erase voltages may be −V, 0, 0, and −V and another set of erase voltages may be −V/2, +V/2, +V/2, and −V/2. The non-volatile memory cell may be programmed by: (1) applying a +V or +V/2 voltage to top gate 702 (via contact 1811, for example); (2) applying a 0 or −V/2 voltage to source region via contact 1807; (3) applying a 0 or −V/2 voltage to drain region via contact 1809; and (4) applying a +V or +V/2 voltage to bottom gate region 505 (via a contact not shown). Thus, one set of program voltages may be +V, 0, 0, and +V ad another set of program voltages may be +V/2, −V/2, −V/2, and +V/2. The non-volatile memory cell may be read by: (1) applying a bias voltage Vg (Vdd, for example) to top gate 702 (via contact 1811, for example); (2) applying a 0 voltage to source region via contact 1807; (3) applying a small voltage (e.g., 0.5 volts) to drain region via contact 1809; and (4) applying a bias voltage Vg (Vdd, for example) to bottom gate region 505 (via a contact not shown).

The non-volatile memory may also be used to store multiple bits, e.g., two bits per cell. In the two-bits per cell mode, storage layer 107 may be used to store one bit and second storage layer 701 may be used to store the second bit. An exemplary table below shows the respective voltages that may be applied to the various electrodes of the non-volatile memory cell to perform various operations.

TABLE 1

| Electrode | Program top bit | Program bottom bit | Erase top bit | Erase bottom bit | Erase all bits | "3-state" read | Read top bit | Read bottom bit |
|---|---|---|---|---|---|---|---|---|
| Top gate | +V or +V/2 | 0 or −V/2 | −V or −V/2 | 0 or +V/2 | −V or −V/2 | Vg | Vg | 0 |
| Source | 0 or −V/2 | 0 or −V/2 | 0 or +V/2 | 0 or +V/2 | 0 or +V/2 | 0 | 0 | 0 |
| Drain | 0 or −V/2 | 0 or −V/2 | 0 or +V/2 | 0 or +V/2 | 0 or +V/2 | Vd (0.5 volts, e.g.) | Vd (0.5 volts, e.g.) | Vd (0.5 volts, e.g.) |
| Bottom gate | 0 or −V/2 | +V or +V/2 | 0 or +V/2 | −V or −V/2 | −V or −V/2 | Vg | 0 | Vg |

As shown in the exemplary table above, the exemplary non-volatile memory cell may be used in as many as two-bits per cell mode. In addition, different types of operations, including programming, erasing, and reading may be performed. In the 3-state read mode, the levels of voltages sensed may be used to read three states, such as 00, 11, and 01 or 10, for example. Thus, in the first state, each stored bit may be 0, in the second state, each stored bit may be 1, and in the third state the two stored bits may have an opposite value to each other. Although the above table, shows a 3-state read mode only, with appropriate voltages, a 4-state read may be performed, as well.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of making a semiconductor device, the method comprising:
providing a first wafer comprising a first semiconductor layer and a first insulating layer on the first semiconductor layer;
providing a second wafer comprising a second insulating layer, a layer of gate material on the second insulating layer, a first storage layer on the layer of gate material, and a semiconductor structure on the first storage layer;
bonding the first insulating layer to the second insulating layer;
cleaving away a first portion of the semiconductor structure to leave a layer of the semiconductor structure after the bonding;
forming a second storage layer over the layer of the semiconductor structure; and
forming a top gate over the second storage layer, wherein the first and second storage layers comprise nanocrystals.

2. The method of claim 1 farther comprising:
forming a bottom gate of the semiconductor device, wherein at least a portion of the bottom gate is formed from the layer of gate material.

3. The method of claim 1 wherein the cleaving further comprises:
implanting a dopant in the semiconductor structure to create a stress layer in the semiconductor structure;
wherein the first portion is removed from the layer of the semiconductor structure at the stress layer.

4. A method of forming a transistor, comprising:
providing a first device structure comprising a first semiconductor layer and a first insulating layer on the first semiconductor layer;
providing a second device structure comprising a second insulating layer, a first layer of gate material on the second insulating layer, a first storage layer on the first layer of gate material, and a third semiconductor layer on the first storage layer;
bonding the first insulating layer to the second insulating layer;
cleaving the third semiconductor layer to leave a semiconductor layer on the first storage layer;
forming a second storage layer over the semiconductor layer;
forming a second layer of gate material over the second storage layer;
patterning the semiconductor layer to leave a first portion of the semiconductor layer to function as a channel of the transistor; and
after the patterning the semiconductor layer, patterning the first layer of gate material to leave a first portion of the first layer of gate material wherein the first portion is covered by the first portion of the semiconductor layer and functions as a bottom gate of the transistor, wherein the first and second storage layers comprise nanocrystals.

5. The method of claim 4 further comprising:
patterning the second layer of gate material to form a top gate of the transistor.

6. The method of claim 5 further comprising:
implanting dopants into portions of the first portion of the semiconductor layer adjacent to the top gate;

forming a sidewall spacer around the top gate; and removing portions of the first portion of the semiconductor layer to leave implanted portions under the sidewall spacer.

7. A method, comprising:

providing a first device structure comprising a first semiconductor layer and a second insulating layer on the first semiconductor layer;

providing a second device structure comprising a third insulating layer, a first layer of gate material on the third insulating layer, a first storage layer on the first layer of gate material, and a third semiconductor layer on the first storage layer;

bonding the second insulating layer to the third insulating layer, wherein the second and third insulating layers comprise a first insulating layer; and cleaving the third semiconductor layer to leave a second semiconductor layer on the first storage layer;

forming a second storage layer on the second semiconductor layer;

forming a second layer of gate material on the second storage layer;

patterning the second layer of gate material to leave a top gate;

implanting the second semiconductor layer using the top gate as a mask to form source and drain regions in the second semiconductor layer;

forming a first sidewall spacer on sides of the top gate; and etching through portions of the source and drain regions, through portions of the first storage layer, and through portions of the first layer of gate material and laterally etching a portion of the first layer of gate material, wherein the etching through portions of the first layer of gate material to remove portions of the first layer of gate material from under the first sidewall spacer leaves a bottom gate, wherein the first and second storage layers comprise nanocrystals.

8. The method of claim 7 further comprising forming a second sidewall spacer on the first sidewall spacer prior to etching through portions of the source and drain regions.

9. The method of claim 8 further comprising:

epitaxially growing semiconductor regions laterally from the source/drain regions.

10. The method of claim 9 further comprising:

siliciding the semiconductor regions to form silicide regions; and contacting the silicide regions.

11. The method of claim 7, further comprising:

pattern etching through the second semiconductor layer, the first storage layer, and the first layer of gate material, wherein portions of the second semiconductor layer, the first storage layer, and the first layer of gate material remain; and filling regions adjacent to the portions of the second semiconductor layer, the first storage layer, and the first layer of gate material with an insulating material.

12. The method of claim 11 further comprising:

etching through the insulating material to expose a sidewall of a portion of the second semiconductor layer; and epitaxially growing semiconductor regions laterally from the source/drain regions.

13. The method of claim 7, wherein the first layer of gate material comprises at least one of polysilicon, amorphous silicon, tungsten, tungsten silicon, germanium, amorphous germanium, titanium, titanium nitride, titanium silicon, titanium silicon nitride, tantalum, tantalum silicon, and tantalum silicon nitride.

14. The method of claim 7 further comprising:

forming a second sidewall spacer around the first sidewall spacer; and etching through portions of the first layer of gate material from at least under the second sidewall spacer to leave a bottom gate under the second storage layer.

15. The method of claim 14 further comprising:

epitaxially growing semiconductor regions laterally from the source/drain regions.

16. The method of claim 15 further comprising:

siliciding the semiconductor regions to form silicide regions; and contacting the silicide regions.

* * * * *